US009130151B2

(12) United States Patent
Butler (10) Patent No.: US 9,130,151 B2
(45) Date of Patent: Sep. 8, 2015

(54) METHOD AND SYSTEM FOR PROVIDING MAGNETIC TUNNELING JUNCTIONS USABLE IN SPIN TRANSFER TORQUE MAGNETIC MEMORIES

(75) Inventor: William H. Butler, Tuscaloosa, AL (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 439 days.

(21) Appl. No.: 13/549,331

(22) Filed: Jul. 13, 2012

(65) Prior Publication Data

US 2012/0326253 A1    Dec. 27, 2012

Related U.S. Application Data

(63) Continuation-in-part of application No. 12/685,418, filed on Jan. 11, 2010, now Pat. No. 8,254,162.

(51) Int. Cl.
| G11C 11/00 | (2006.01) |
| H01L 43/08 | (2006.01) |
| B82Y 25/00 | (2011.01) |
| B82Y 40/00 | (2011.01) |
| H01F 10/32 | (2006.01) |
| H01F 41/30 | (2006.01) |
| H01L 43/12 | (2006.01) |
| G11C 11/16 | (2006.01) |
(Continued)

(52) U.S. Cl.
CPC .............. *H01L 43/08* (2013.01); *B82Y 20/00* (2013.01); *B82Y 25/00* (2013.01); *B82Y 40/00* (2013.01); *G11C 11/161* (2013.01); *H01F 10/329* (2013.01); *H01F 10/3254* (2013.01); *H01F 10/3286* (2013.01); *H01F 41/307* (2013.01); *H01F 41/325* (2013.01); *H01L 43/12* (2013.01); *H01F 10/123* (2013.01); *H01L 27/228* (2013.01)

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 977/933–935
See application file for complete search history.

(56) References Cited

U.S. PATENT DOCUMENTS

| 6,020,000 A | 2/2000 | Wong |
| 6,532,164 B2 | 3/2003 | Redon |

(Continued)

OTHER PUBLICATIONS

Office Action issued Apr. 2008 for U.S. Appl. No. 11/239,969.
(Continued)

*Primary Examiner* — Harry W Byrne
(74) *Attorney, Agent, or Firm* — Convergent Law Group LLP (57) ABSTRACT

A method and system provide a magnetic junction. A free layer, a symmetry filter, and a pinned layer are provided. The free layer has a magnetic moment switchable between stable states when a write current is passed through the magnetic junction. The symmetry filter transmits charge carriers having a first symmetry with higher probability than charge carriers having another symmetry. The symmetry filter resides between the free layer and the pinned layer. The free layer and/or the pinned layer lies in a plane, has the charge carriers of the first symmetry in a spin channel at a Fermi level, lacks the charge carriers of the first symmetry at the Fermi level in another spin channel, and has a nonzero magnetic moment component perpendicular to the plane. The free layer and/or the pinned layer and the symmetry filter has at least one lattice mismatch of less than seven percent.

16 Claims, 7 Drawing Sheets

(51) Int. Cl.
*B82Y 20/00* (2011.01)
*H01F 41/32* (2006.01)
*H01L 27/22* (2006.01)
*H01F 10/12* (2006.01)

(56) References Cited

U.S. PATENT DOCUMENTS

| | | | |
|---|---|---|---|
| 6,611,405 | B1 | 8/2003 | Inomata |
| 6,771,534 | B2 | 8/2004 | Stipe |
| 6,967,863 | B2 | 11/2005 | Huai |
| 7,061,797 | B1 * | 6/2006 | Miltat et al. ............... 365/171 |
| 7,101,600 | B1 | 9/2006 | Kim |
| 7,106,624 | B2 | 9/2006 | Huai et al. |
| 7,241,631 | B2 | 7/2007 | Huai |
| 7,598,555 | B1 | 10/2009 | Parkin |
| 7,630,234 | B2 | 12/2009 | Sugibayshi |
| 7,826,258 | B2 | 11/2010 | Zhu |
| 2002/0105827 | A1 | 8/2002 | Redon |
| 2003/0007398 | A1 | 1/2003 | Daughton |
| 2003/0059588 | A1 | 3/2003 | Hannah |
| 2003/0227807 | A1 | 12/2003 | Nakamura |
| 2004/0012994 | A1 * | 1/2004 | Slaughter et al. ........... 365/158 |
| 2004/0125647 | A1 | 7/2004 | Tsuchida |
| 2005/0040433 | A1 | 2/2005 | Nozieres |
| 2005/0042367 | A1 | 2/2005 | Nemoto |
| 2005/0104101 | A1 | 5/2005 | Sun |
| 2005/0106810 | A1 * | 5/2005 | Pakala et al. ................ 438/257 |
| 2005/0174702 | A1 | 8/2005 | Gill |
| 2006/0017083 | A1 * | 1/2006 | Slaughter et al. ........... 257/295 |
| 2006/0087880 | A1 * | 4/2006 | Mancoff et al. ............. 365/158 |
| 2007/0091670 | A1 | 4/2007 | Hidaka |
| 2008/0007992 | A1 | 1/2008 | Wang |
| 2008/0026253 | A1 | 1/2008 | Yuasa |
| 2008/0246104 | A1 | 10/2008 | Ranjan |

OTHER PUBLICATIONS

Office Action issued Sep. 2008 for U.S. Appl. No. 11/239,969.
Office Action issued Jan. 2010 for U.S. Appl. No. 12/133,671.
Office Action issued Apr. 2009 for U.S. Appl. No. 12/133,671.
Office Action issued Mar. 2011 for U.S. Appl. No. 12/638,902.
IOP Publishing, Science and Technology of Advanced Materials 9, William H. Butler, Tunneling Magnetoresistance From a Symmetry Filtering Effect, pp. 1-17, Apr. 21, 2008.
Japanese abstract of publication No. 11-120758, Apr. 30, 1999, Nonvolatile Random Access Memory, Eric Maiken.
Albert, et al., "Polarized Current Switching of a CO Thin Film Nanomagnet," American Institute of Physics, 77(23): 3809-11, 2000.
Berger, "Emission of spin waves by a magnetic multilayer traversed by a current," Physical Review B, 54(13), 9953-58, 1996.
Butler, et al., "Spin Dependent Tunneling Conductance of Fe/MgO/Fe Sandwiches," Physical Review B, 63: 092409, 2001.
Ideda, et al., "A perpendicular anisotrophy COFeB—MgO magnetic tunnel junction," Nature Materials Online, Jul. 11, 2010, DOI:10.1038/NMAT2804.
Katine, et al., "Current-Driven Magnetization Reversal and Spin-Wave Excitations in CO/Cu/Co Pillars," Physical Review Letters, 84(14): 3149-52, 2000.
Myers, "Point-contact studies of current-controlled domain switching in magnetic multilayers," Journal of Applied Physics, vol. 87-No. 9, May 1, 2000, pp. 5502-5503.
Nishimura, et al., "Magnetic tunnel junction device with perpendicular magnetization films for high-density magnetic random access memory," Journal of Applied Physics, 90(8): 5246-49, 2002.
Parkin, et al., "Giant tunneling magnetoresistance at room temperature with MgO (100) tunnel barriers," Nature Materials 3:862-7, 2004.
Slonczewski, "Conductance and exchange coupling of two ferromagnets separated by a tunneling barrier," Physical Review B, 39(10): 6995-7002, 1989.
Sloczewski, "Current-driven excitation of magnetic multilayers," Journal of Magnetism and Magnetic Materials, 159: L1-L7, 1996.
Sloczewski, "Theory and Application of Exchange-Driven Switching," IEEE, pp. CE-02, 2000.
Sun, "Current-driven magnetic switching in manganite trilayer junctions," Journal of Magnetism and Magnetic Materials, No. 202, 1999, pp. 157-162.
Zhang, "Large magnetoresistance in bcc Co/MgO/Co and FeCo/MgO/FeCo tunneling junctions," Physics Review B 70: 172407, 2004.
PCT International Search Report and Written Opinion of the ISA, application No. PCT/US08/64794.
PCT International Search Report and Written Opinion of the ISA, application No. PCT/US08/66369.
PCT International Search Report and Written Opinion of the ISA, application No. PCT/US10/47941.
PCT International Search Report and Written Opinion of the ISA, application No. PCT/US10/59184.

* cited by examiner

METHOD AND SYSTEM FOR PROVIDING MAGNETIC TUNNELING JUNCTIONS USABLE IN SPIN TRANSFER TORQUE MAGNETIC MEMORIES

CROSS-REFERENCE TO RELATED APPLICATIONS

The present application is a continuation-in-part of co-pending patent application Ser. No. 12/685,418, filed Jan. 11, 2010, entitled "Method and System for Providing Magnetic Tunneling Junctions Usable in Spin Transfer Torque Magnetic Memories", and assigned to the assignee of the present application.

GOVERNMENT RIGHTS

This invention was made with U.S. Government support under Grant/Contract No. HR0011-09-C-0023 awarded by DARPA. The U.S. Government retains certain rights in this invention. Distribution authorized to U.S. Government Agencies only.

BACKGROUND OF THE INVENTION

Magnetic memories, particularly magnetic random access memories (MRAMs), have drawn increasing interest due to their potential for high read/write speed, endurance, non-volatility and low power consumption during operation. One type of MRAM is a spin transfer torque random access memory (STT-RAM). STT-RAM utilizes magnetic junctions written at least in part by a current driven through the magnetic junction.

Figure 1:
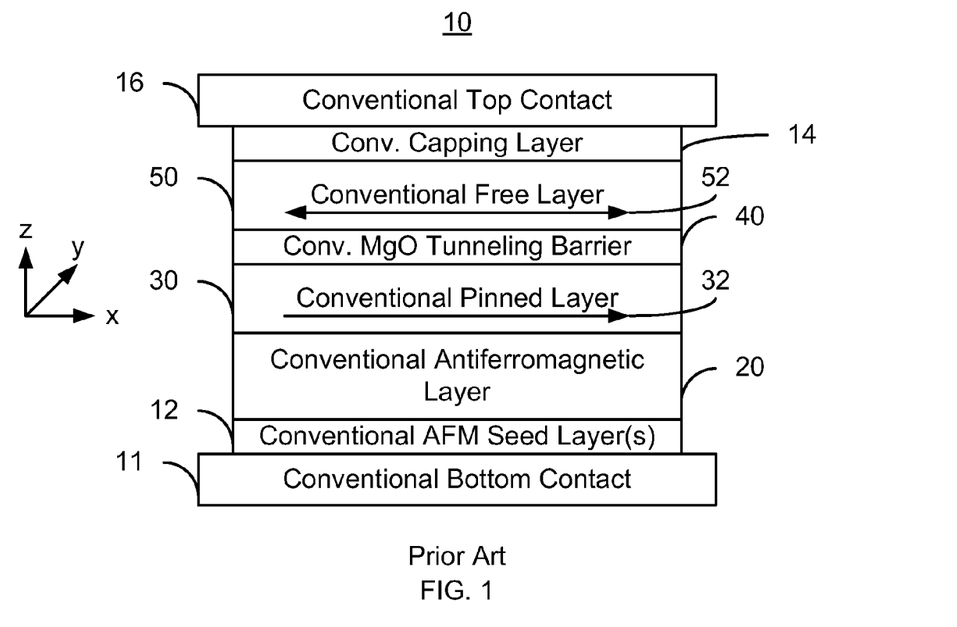
FIG. 1 depicts a conventional magnetic tunneling junction.

FIG. 1 depicts a conventional magnetic tunneling junction (MTJ) 10 as it may be used in a conventional STT-RAM. The conventional MTJ 10 typically resides on a bottom contact 11, uses conventional seed layer(s) 12 and is under a top contact 16. The conventional MTJ 10 includes a conventional antiferromagnetic (AFM) layer 20, a conventional pinned layer 30, a conventional tunneling barrier layer 40, and a conventional free layer 50. Also shown is a conventional capping layer 14. The conventional free layer 50 has a changeable magnetic moment 52, while the magnetic moment 43 of the conventional pinned layer 30 is stable. More specifically, the magnetic moment 32 of the conventional pinned layer 30 is fixed by an interaction with the conventional AFM layer 20.

Conventional contacts 12 and 16 are used in driving the current in a current-perpendicular-to-plane (CPP) direction, or along the z-axis as shown in FIG. 1. Current passing through the conventional pinned layer 30 becomes spin polarized and carries angular momentum. This angular momentum may be transferred to the conventional free layer 50. If a sufficient amount of angular momentum is so transferred, the magnetic moment 52 of the free layer 50 may be switched to be parallel or antiparallel to the magnetic moment 32 of the pinned layer 30.

To improve the performance of STT-RAM, various factors of the conventional magnetic junction 10 are desired to be optimized. For example, the conventional magnetic junction 10 may be engineered for a desired critical current, $I_c$, for switching a thermally stable conventional free layer 50. The critical current may be estimated by:

$$I_c = \frac{\alpha}{\eta} \frac{\langle H \rangle_{eff}}{H_K} 1.5 \text{ mA}$$

where $\langle H \rangle_{eff}$ is the averaged effective magnetic field seen by the precessing magnetic moments of the conventional free layer 50, $H_k$ is the magnetic field necessary to switch the magnetic moment 52 when applied along the easy axis, $\alpha$ is the damping parameter, $\eta$ is the spin-torque efficiency, and 1.5 mA represents current and is appropriate to a thermal stability factor ($\Delta E/k_B T$) of 60, where $\Delta E$ represents the energy barrier for thermal switching, $k_B$ is Boltzmann's constant and T is the absolute temperature.

The conventional magnetic junction 10 may be optimized to improve the critical current. Engineering the conventional magnetic junction 10 may include use of CoFe and/or CoFeB for the conventional pinned layer 30 and the conventional free layer 50. CoFe and CoFeB tend to have in-plane magnetic moments, as shown by the magnetic moments 32 and 52. In addition, the conventional tunneling barrier 40 is typically crystalline MgO. The combination of CoFe and CoFeB with MgO may result in a lower critical current.

Although the conventional magnetic tunneling junction 10 functions, further improvements are desired. For example, magnetic junctions usable in magnetic memories that may be smaller, scalable to smaller dimensions, use a lower critical current, may be simple to fabricate, and/or have other properties are desired.

Accordingly, what is desired is an improved magnetic junction usable in higher density STT-RAM.

BRIEF SUMMARY OF THE INVENTION

A method and system for providing a magnetic junction are described. The method and system includes providing a free layer, a symmetry filter, and a pinned layer. The free layer has a first magnetic moment switchable between a plurality of stable magnetic states when a write current is passed through the magnetic junction. The symmetry filter transmits charge carriers having a first symmetry with higher probability than charge carriers having another symmetry. The pinned layer has a second magnetic moment pinned in a particular direction. The symmetry filter resides between the free layer and the pinned layer. At least one of the free layer and the pinned layer has the charge carriers of the first symmetry in a spin channel at the Fermi level, lacks the charge carriers of the first symmetry at the Fermi level in another spin channel, lies in a plane, and has a nonzero magnetic moment component substantially perpendicular to plane. The free layer and/or the pinned layer and the symmetry filter has at least one lattice mismatch of less than seven percent. In some aspects, the symmetry filter includes at least one of Ge, GaAs and ZnSe.

DETAILED DESCRIPTION OF THE INVENTION

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A method and system for providing a magnetic junction are described. The method and system include providing a free layer, a symmetry filter, and a pinned layer. The free layer has a first magnetic moment switchable between a plurality of stable magnetic states when a write current is passed through the magnetic junction. The symmetry filter transmits charge carriers having a first symmetry with higher probability than the charge carriers having other symmetries. The pinned layer has a second magnetic moment pinned in a particular direction. The symmetry filter resides between the free layer and the pinned layer. At least one of the free layer and the pinned layer has the charge carriers of the first symmetry in one spin channel at the Fermi level, lacks the charge carriers of the first symmetry at the Fermi level in the other spin channel, lies in a plane, and has a nonzero magnetic moment component substantially perpendicular to the plane. The free layer and/or the pinned layer and the symmetry filter has at least one lattice mismatch of less than seven percent. In some aspects, the at least one lattice mismatch may be less than three percent or four percent. In some aspects, the symmetry filter includes at least one of Ge, GaAs and ZnSe.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions having particular layers. However, one of ordinary skill in the art will readily recognize that magnetic junctions having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single elements. However, one of ordinary skill in the art will readily recognize that the method and system are consistent with the use of magnetic memories having multiple elements. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
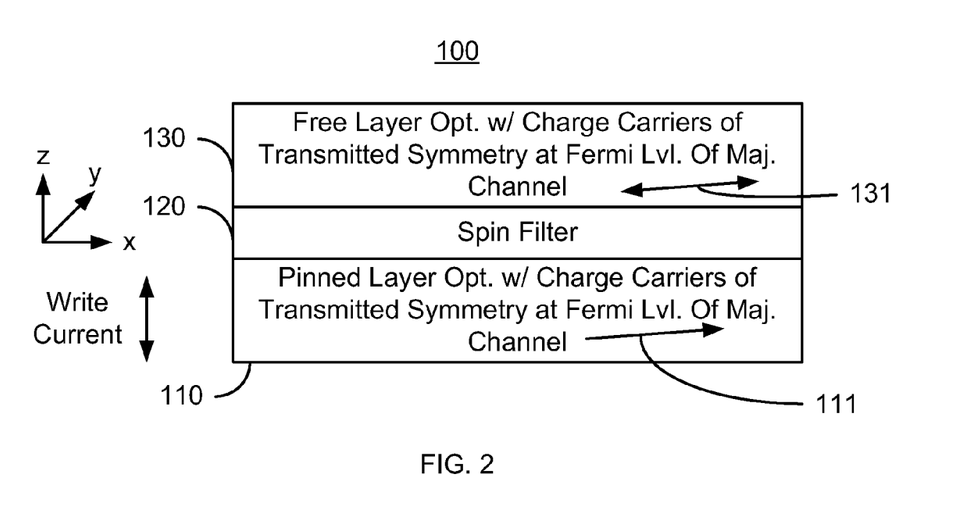
FIG. 2 depicts an exemplary embodiment of a magnetic junction suitable for use in a magnetic memory.

FIG. 2 depicts an exemplary embodiment of a magnetic junction 100. For example, the magnetic junction 100 may be used in magnetic memory in which current is to be driven through the magnetic junction 100 in a CPP direction. For clarity, FIG. 2 is not drawn to scale and some portions of the magnetic junction 100 might be omitted. The magnetic junction 100 includes a pinned layer 110, a spin filter 120, and a free layer 130. The magnetic junction 100 may also include other layer(s) (not shown).

The free layer 130 is a magnetic layer having a changeable magnetic moment 131. The magnetic moment 131 is shown as having arrows at both ends to indicate that the magnetic moment 131 may change direction. The magnetic moment 131 is switchable between stable magnetic states when a write current is passed through the magnetic junction 100. Thus, in the exemplary embodiment depicted in FIG. 2, spin transfer torque may be used to switch the magnetic moment 131 of the free layer 130. For example current driven in the z direction can switch the magnetic moment 131 to be parallel or antiparallel to the magnetic moment 111 of the pinned layer 110. In some embodiments, the free layer 130 has a thickness of at least one nanometer and not more than ten nanometers. However, other thicknesses are possible. Although depicted as a simple layer with a single magnetic moment 131, the free layer 130 may also include multiple ferromagnetic and/or nonmagnetic layers. For example, the free layer 130 may be a synthetic antiferromagnet (SAF) including magnetic layers antiferromagnetically or ferromagnetically coupled through one or more thin layers, such as Ru. The free layer 130 may also be another multilayer in which one or more sublayers are magnetic. Other structures for the free layer 130 may also be used.

In the embodiment shown, the free layer 130 has an easy axis along the magnetic moment 131. The magnetic moment 131 is stable along the easy axis. In the embodiment shown, the magnetic moment has a component in-plane. Stated differently, the magnetic moment 131 has a component that is substantially within the plane of the free layer 130. In the embodiment shown, therefore, the magnetic moment 131 has a component parallel to the x-y plane. In addition, the free layer magnetic moment 131 has a component that is substantially perpendicular to plane. Stated differently the free layer magnetic moment 131 has a component parallel to the z-axis of FIG. 2. In some embodiments, the magnetic moment 131 may be perpendicular to plane. In such embodiments, the in-plane component of the magnetic moment 131 is zero. In such embodiments, the free layer 130 may include materials such as AlMn. In some such embodiments, the free layer 130 may consist of AlMn in an $L1_0$ phase, with a (100) axis perpendicular to the plane. In other embodiments, the free layer 130 may include MnGa and/or MnIn.

The symmetry filter 120 is a layer that transmits charge carriers having a first symmetry with higher probability than the charge carriers having another symmetry. Transmission may be via tunneling. In some embodiments, the symmetry filter 120 transmits only charge carriers that have the first symmetry with a higher probability. All other symmetries would have a lower probability of transmission. For example, the symmetry filter 120 may be crystalline MgO having a (100) texture. Such a layer transmits current carriers with wave functions having a $\Delta_1$ symmetry in the (100) direction with higher probability than current carriers with wave functions having other symmetries. Thus, the symmetry filter 120 may be considered to function in a similar manner to a filter that passes current carriers that have the first symmetry, but does not pass the current carriers having other symmetries. In other embodiments, other materials may be used. For example, $SrSnO_3$ may be used. Although insulators used as tunneling barriers are described for the symmetry filter 120, in other embodiments other materials having other electrical properties may be used.

The pinned layer 110 has a magnetic moment 111 pinned in a particular direction. For example, the magnetic moment 111 may be pinned by an AFM layer (not shown), a hard magnetic (not shown) or via some other mechanism. The pinned layer 110 shown is a simple layer, consisting of a single magnetic layer. Although depicted as a simple layer with a single magnetic moment 111, the pinned layer 110 may include multiple layers. For example, the pinned layer 110 may be a SAF including magnetic layers antiferromagnetically or ferromagnetically coupled through one or more thin layers, such as Ru. The pinned layer 110 may also be another multilayer in which one or more sublayers are magnetic. Other structures for the pinned layer 110 may also be used.

In the embodiment shown, the magnetic moment 111 is pinned such that it has a component in-plane. Stated differently, the magnetic moment 111 has a component that is substantially within the plane of the pinned layer 110. In the embodiment shown, therefore, the magnetic moment 111 has a component parallel to the x-y plane. In addition, the magnetic moment 111 has a component that is substantially perpendicular to plane. Stated differently the magnetic moment 111 has a component parallel to the z-axis of FIG. 2. In some embodiments, the magnetic moment 111 may be perpendicular to the plane. In such embodiments, the magnetic moment 111 has a zero in-plane component. In such embodiments, the pinned layer 110 may include materials such as AlMn. In some such embodiments, the pinned layer 110 may consist of AlMn in an $L1_0$ phase, with a (100) orientation. In other embodiments, the pinned layer 110 may include MnGa.

The free layer 130 and/or the pinned layer 110 are configured such that at least one of the layers 110 and 130 has the charge carriers of the symmetry transmitted by the symmetry filter 120 at a Fermi level in one spin channel. In addition, at least one of the free layer 130 and the pinned layer 110 lacks the charge carriers of the symmetry at the Fermi level in another spin channel. Such a free layer and/or pinned layer 110 also has a component of its magnetization 131/111 perpendicular to plane. For example, the free layer 130 and/or the pinned layer 110 may have charge carriers with the symmetry at the Fermi level in a majority spin channel but not have the charge carriers with the symmetry at the Fermi level in a minority spin channel. In a ferromagnetic material, the majority spin channel has electrons with their spins aligned with the net magnetization direction. The minority spin channel electrons have their spins antiparallel to the majority spin channel electrons. For a symmetry filter 120 that transmits current carriers having a $\Delta_1$ symmetry, such as MgO having a (100) texture, the layers 110 and/or 130 may have current carriers of $\Delta_1$ symmetry at the Fermi level in the majority spin channel. However, the minority spin channel either does not have current carriers of $\Delta_1$ symmetry or has current carriers of $\Delta_1$ symmetry spaced from the Fermi level. In some embodiments, the layer 110 and/or 130 having these properties also has a magnetization perpendicular to plane.

Figure 3:
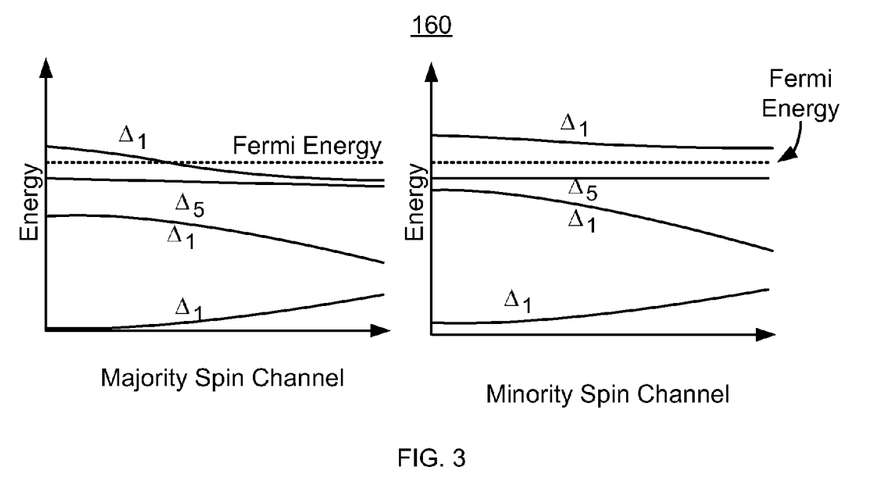
FIG. 3 depicts an exemplary embodiment of the band structures for the majority and minority spin channels in the free and/or pinned layer(s) of the exemplary embodiment of the magnetic junction.

For example, it has been discovered that a free layer 130 and/or pinned layer 110 including AlMn of a $L1_0$ phase and (100) orientation has a perpendicular magnetic moment and has desired symmetries at the Fermi level. More specifically, if the pinned layer 110 includes AlMn in the $L1_0$ phase with its (100) axis perpendicular to plane, the pinned layer 110 would have a magnetic moment 111 perpendicular to plane. In addition, the pinned layer 110 would have charge carriers having a $\Delta_1$ symmetry at the Fermi level in the majority spin channel. Charge carriers having the $\Delta_1$ symmetry for the majority spin channel are thus more likely to carry current through the pinned layer 110. The pinned layer 110 having such a composition and structure also has no charge carriers in the minority spin channel with a $\Delta_1$ symmetry in the (001) direction. The band structure 160 of an exemplary embodiment of such a layer is depicted in FIG. 3. Note, however, that the energy bands shown are for exemplary purposes only, and not intended to accurately reflect the band structure of such a material. As can be seen in the band structure, the majority spin channel has $\Delta_1$ symmetry charge carriers at the Fermi level. As such, $\Delta_1$ symmetry charge carriers are likely to carry current through the pinned layer 110. A free layer 130 having the same crystal structure and composition may have similar properties. Similarly, a free layer 130 and/or pinned layer 110 may include MnGa and have analogous properties to those described above.

Figure 4:
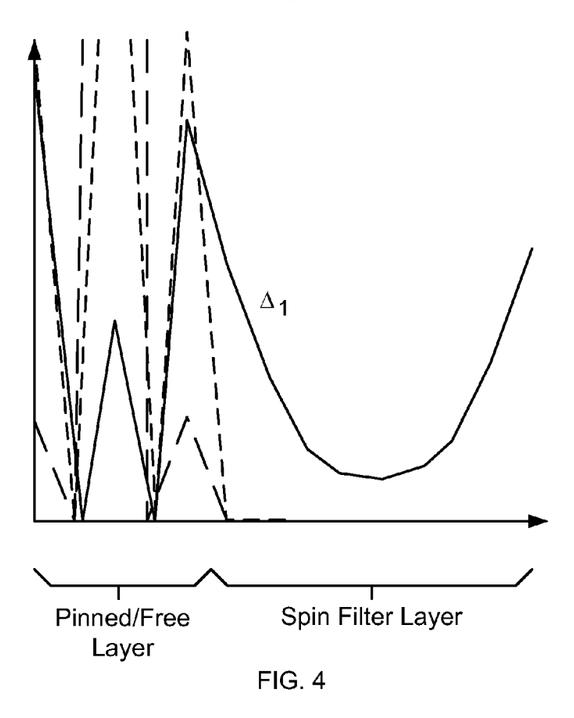
FIG. 4 depicts an exemplary embodiment of transmission of charge carriers through a symmetry filter based upon wave function symmetry.

Such a pinned layer 110 and/or free layer 130 may be used in conjunction with a spin filter 120 that has a high probability for transmitting charge carriers having a $\Delta_1$ symmetry, but a lower probability for transmission of charge carrier having wave functions of other symmetries. Thus, although all wave functions for charge carriers are expected to decay in an insulating spin filter, the $\Delta_1$ wave functions decay more slowly. From the point of view of transmission and reflection, the charge carriers with $\Delta_1$ symmetry are transmitted with higher probability than the electrons with wave functions of other symmetries. The charge carriers that are not transmitted may be reflected. For example, MgO having a (100) orientation tends to transmit electrons with wave functions having a particular, $\Delta_1$, symmetry with a higher probability than electrons with wave functions having other symmetries. FIG. 4 illustrates the relatively slow decay of the $\Delta_1$ wave function in the MgO compared to the states of other symmetries. Because the majority spin channel has $\Delta_1$ symmetry at the Fermi level, majority charge carriers from the Fermi level in the pinned layer 110 and the free layer 130 are much more likely to be transmitted through the spin filter 120. As a result, a high degree of spin polarization may be achieved. Thus, efficiency of the spin torque induced transitions may be improved, and the critical current reduced. In this manner, the magnetic junction 100 functions in a similar manner to the conventional magnetic junction 100, which uses CoFe having $\Delta_1$ electrons in at the Fermi level in the majority spin channel and no $\Delta_1$ electrons at the Fermi level in the minority spin channel.

Further, for a material such as AlMn, the magnetic moment 111/131 may be perpendicular to plane. For AlMn, therefore, the quantity $<H>_{eff}/H_k$ is at or close to one. This feature may further reduce the critical current. As a result, performance of the magnetic junction 100 may be improved. Thus, the magnetic junction 100 may be used in a magnetic memory, such as STT-RAM, having improved performance. Other uses of the magnetic junction 100 are also possible.

In addition, the symmetry filter 120 may have additional properties with respect to the pinned layer 110 and/or the free layer 130. In some embodiments, the lattice mismatch between one or both of the layers 110 and 130 adjoining the symmetry filter 120 may be desired to be low. For example, the lattice mismatch between the layer 120 and the layer(s) 110 and/or 130 may be less than seven percent. In some embodiments, the lattice mismatch between the layer 120 and the layer(s) 110 and/or 130 may be less than three percent or four percent. The lattice mismatch is the difference between the lattice sites for adjoining layers. The lattice mismatch thus depends upon both the lattice parameters of the layers and the texture of the layers. The smaller lattice mismatch may give rise to an increased probability that the magnetic layer(s) 110 and/or 130 have the desired magnetic anisotropy. In some embodiments, MgO (001) may have a lattice mismatch of at least seven percent with $L1_0$ AlMn. In some embodiments, this larger lattice mismatch may result in the pinned layer 110 and/or the free layer 130 having a different magnetic anisotropy. This mismatch induced magnetic anisotropy may result in an in-plane magnetic moment for the free layer 130 and/or the pinned layer 110. In some embodiments, this is undesirable. Further, in some cases the lattice mismatch may adversely affect the band structure. This can result in reduced polarization of current carriers, which is undesirable. Consequently, a reduced lattice mismatch may be desired to achieve a desired magnetic anisotropy and/or spin polarization. For example, the free layer 130 and/or the pinned layer 110 may have a higher perpendicular magnetic anisotropy and a perpendicular-to-plane magnetic moment. Similarly, the free layer 130 and/or pinned layer 110 may have more electrons in a majority spin channel and fewer (or no) electrons in the other spin channel.

The reduced lattice mismatch may be achieved in a number of ways. In some embodiments, the lattice of the symmetry filter layer 120 is contracted or expanded to be closer to that of the pinned layer 110 and/or free layer 130. For example, the lattice parameter of MgO used in the symmetry filter 120 may be larger than the lattice parameter of the material (e.g. AlMn $L1_0$) used in the pinned layer 110 and/or free layer 130. Thus, the lattice of the symmetry filter layer 120 is desired to be contracted. In some embodiments, this is achieved by using Ge, GaAs, ZnSe, or other symmetry filters having a lattice parameter that is lower than the lattice parameter of MgO in the symmetry filter 120. The lattice parameter of the symmetry filter 120 is thus closer to the lattice parameter of AlMn $L1_0$ and/or other material(s) used for the pinned layer 110/free layer 130. The resulting lattice mismatch between the symmetry filter layer 120 and the pinned layer 110 and/or free layer 130 may be less than seven percent. In some embodiments, the lattice mismatch between the symmetry filter layer 120 and the layer(s) 110 and/or 130 may be less than three percent or four percent. Thus, the lattice of the material used for the symmetry layer 120 may be contracted to be closer to that of the pinned layer 110 and/or free layer 130. In other embodiments, the lattice of the pinned layer 110 and/or free layer 130 may be expanded. In some embodiments, this might be achieved through doping or other mechanisms that can increase the lattice parameter of AlMn or other material used in the layer(s) 110 and/or 130. In other embodiments, other material(s) may be used for the layer(s) 110 and/or 130. For example, MnGa and/or MnIn may be used. However, the mechanisms used to more closely match the lattices are desired not to unduly interfere with the magnetic properties of the layers 110 and 130.

Figure 5:
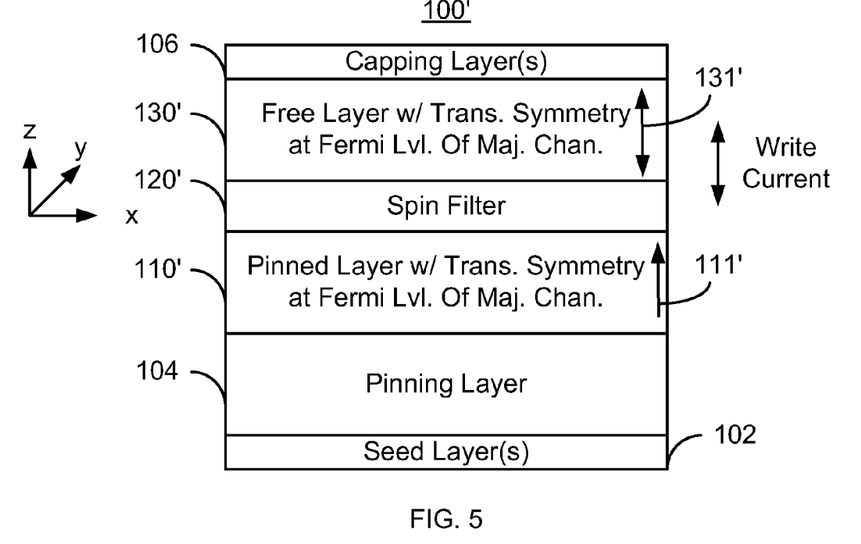
FIG. 5 depicts another exemplary embodiment of a magnetic junction suitable for use in a magnetic memory in which both the free layer and the pinned layer have a state at the Fermi energy with a symmetry that is preferentially transmitted by the spin filter layer.

FIG. 5 depicts another exemplary embodiment of a magnetic junction 100' that may be used in a magnetic memory. For clarity, FIG. 5 is not to scale. The magnetic junction 100' includes components analogous to the magnetic junction 100 depicted in FIG. 2. Consequently, analogous components are labeled similarly. Thus, the magnetic junction 100' includes a pinned layer 110', a symmetry filter 120', and a free layer 130' analogous to the pinned layer 110, the symmetry filter 120, and the free layer 130, respectively. Also shown are seed layer(s) 102, pinning layer 104, and capping layer 106. In other embodiments, the seed layer(s) 102, pinning layer 104, and/or capping layer 106 may be omitted. In addition, contacts (not shown) may also be provided to drive current in the desired direction. The seed layer(s) 102 may be used to provide a template for the desired crystal structure of the pinning layer 104. The pinning layer 104 may include an AFM layer, a hard magnet or other material used to pin the magnetization of the pinned layer 110'.

In the embodiment shown, the magnetic moment 111' of the pinned layer 110' and the magnetic moment 131' of the free layer 130' are perpendicular to plane. In addition, both the free layer 130' and the pinned layer 110' are configured such that each of the layers 110' and 130' has its charge carriers of the symmetry transmitted by the symmetry filter 120 with a higher probability at a Fermi level in a first spin channel, such as the majority spin channel. In some embodiments, at least one of the free layer 130' and the pinned layer 110' lacks the charge carriers of the symmetry at the Fermi level in the other spin channel (e.g. the minority spin channel). For example, both the pinned layer 110' and the free layer 130' may include AlMn having an $L1_0$ crystal structure and a (100) axis perpendicular to plane. Such a material has $\Delta_1$ electrons at the Fermi level in the majority spin channel, but no $\Delta_1$ electrons in the (100) direction in the minority spin channel. In addition MgO having a (100) texture or $SrSnO_3$ may be used as the spin filter 120'. In some embodiments, the lattice mismatch between the symmetry filter 120' and the layer(s) 110' and/or 130' is less than seven percent. In some embodiments, the lattice mismatch between the symmetry filter layer 120' and the layer(s) 110' and/or 130' may be less than three percent or four percent. For example, the symmetry filter 120' may include Ge, GaAs and or ZnSe. The pinned layer 110' and/or the free layer 130' may include MnGa and/or MnIn.

The magnetic junction 100' shares the benefits of the magnetic junction 100. Because the magnetic moments 111' and 131' are perpendicular to plane, the quantity $<H>_{eff}/H_k$ is one. In addition, the spin polarization efficiency may be improved. Consequently, performance of the magnetic junction may be enhanced.

Figure 6:
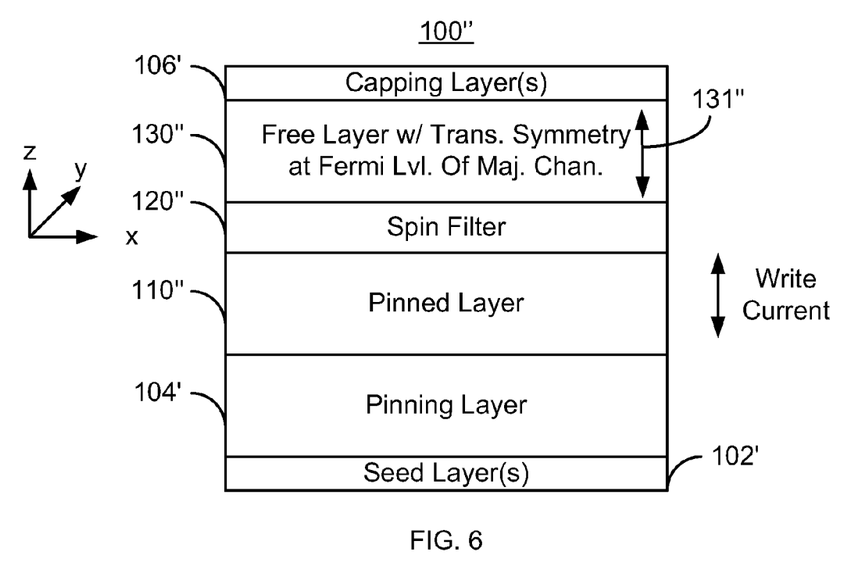
FIG. 6 depicts another exemplary embodiment of a magnetic junction suitable for use in a magnetic memory.

FIG. 6 depicts another exemplary embodiment of a magnetic junction 100" suitable for use in a magnetic memory. For clarity, FIG. 6 is not to scale. The magnetic junction 100" includes components analogous to the magnetic junctions 100/100'. Consequently, analogous components are labeled similarly. Thus, the magnetic junction 100" includes a pinned layer 110", a symmetry filter 120", and a free layer 130" analogous to the pinned layer 110/110', the symmetry filter 120/120', and the free layer 130/130', respectively. Also shown are seed layer(s) 102', pinning layer 104', and capping layer 106'. In other embodiments, the seed layer(s) 102', pinning layer 104', and/or capping layer 106' may be omitted. The seed layer(s) 102' may be used to provide a template for the desired crystal structure of the pinning layer 104'. The pinning layer 104' may include an AFM layer, a hard magnet or other material used to pin the magnetization of the pinned layer 110". In addition, contacts (not shown) may also be provided to drive current in the desired direction.

In the embodiment shown, the magnetic moment 131" of the free layer 130" is perpendicular to plane. In addition, the free layer 130" is configured such that the layer and 130' has its charge carriers of the symmetry transmitted by the symmetry filter 120" with a higher probability at a Fermi level in a spin channel, such as a majority spin channel. In some embodiments, the free layer 130" lacks the charge carriers of the symmetry at the Fermi level in the other spin channel, such as the minority spin channel. For example, the free layer 130" may include AlMn having an $L1_0$ crystal structure and a (100) axis perpendicular to plane. In addition MgO having a (100) texture or $SrSnO_3$ may be used as the spin filter 120". The pinned layer 110" may include other magnetic materials. For example, the pinned layer 110" include bcc (001) Fe, bcc (001) Co, and/or bcc (001) FeCo. In some embodiments, the pinned layer 110" may still have its magnetization (not shown in FIG. 6) perpendicular to the plane. However, other orientations are possible. In some embodiments, the lattice mismatch between the symmetry filter 120" and the layer(s) 110" and/or 130" is less than seven percent. In some embodiments, the lattice mismatch between the symmetry filter layer 120" and the layer(s) 110" and/or 130" may be less than three percent or four percent. For example, the symmetry filter 120" may include Ge, GaAs and or ZnSe. The pinned layer 110" and/or the free layer 130" may include MnGa and/or MnIn.

The magnetic junction 100" shares the benefits of the magnetic junctions 100/100'. Because the magnetic moment 131' is perpendicular to plane, the quantity $<H>_{eff}/H_k$ is one. In addition, the spin polarization efficiency may be improved. Consequently, performance of the magnetic junction 100" may be enhanced.

Figure 7:
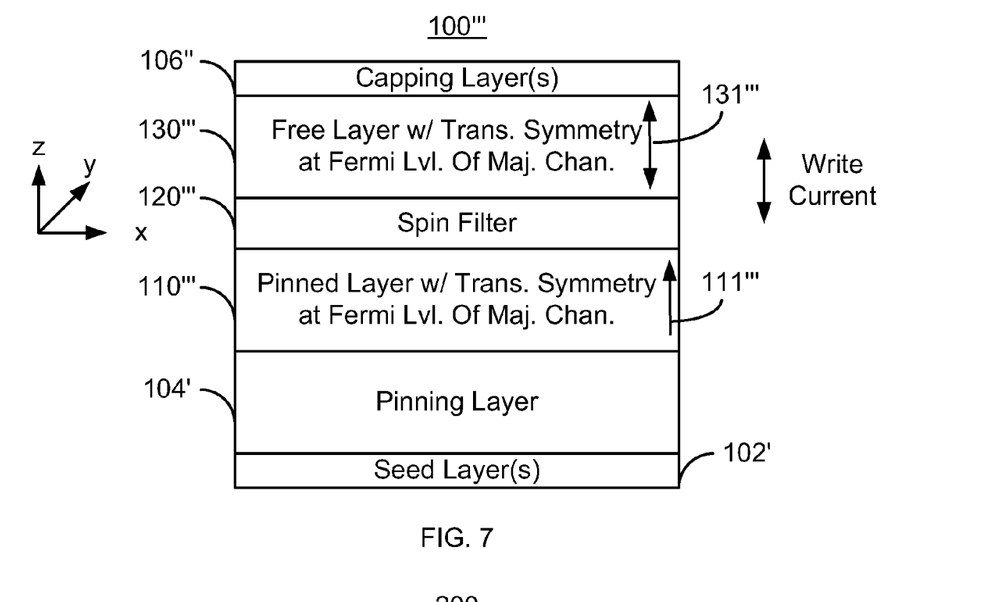
FIG. 7 depicts another exemplary embodiment of a magnetic junction suitable for use in a magnetic memory.

FIG. 7 depicts another exemplary embodiment of a magnetic junction 100''' suitable for use in a magnetic memory. For clarity, FIG. 7 is not to scale. The magnetic junction 100''' includes components analogous to the magnetic junctions 100/100'/100". Consequently, analogous components are labeled similarly. Thus, the magnetic junction 100''' includes a pinned layer 110''', a symmetry filter 120''', and a free layer 130''' analogous to the pinned layer 110/110'/110", the symmetry filter 120/120'/120", and the free layer 130/130'/130", respectively. Also shown are seed layer(s) 102", pinning layer 104", and capping layer 106". In other embodiments, the seed layer(s) 102", pinning layer 104", and/or capping layer 106" may be omitted. The seed layer(s) 102" may be used to provide a template for the desired crystal structure of the pinning layer 104". The pinning layer 104''' may include an AFM layer, a hard magnet or other material used to pin the magnetization of the pinned layer 110'''. In addition, contacts (not shown) may also be provided to drive current in the desired direction.

In the embodiment shown, the magnetic moment 111''' of the pinned layer 110''' is perpendicular to plane. In addition, the pinned layer 110''' is configured such that the pinned layer 110''' has its charge carriers of the symmetry transmitted by the symmetry filter 120''' at a Fermi level in a majority spin channel. In some embodiments, the pinned layer 110''' lacks the charge carriers of the symmetry at the Fermi level in a minority spin channel. For example, the pinned layer 110''' may include AlMn having an $L1_0$ crystal structure and a (100) axis perpendicular to plane. In addition MgO having a (100) texture or $SrSnO_3$ may be used as the spin filter 120'''. The free layer 130''' may include other magnetic materials. For example, the free layer 130''' include bcc (001) Fe, bcc (001) Co, and/or bcc (001) FeCo. In the embodiment shown, the free layer 130''' has its magnetization 131'''0 perpendicular to plane. However, other orientations are possible. In some embodiments, the lattice mismatch between the symmetry filter 120''' and the layer(s) 110''' and/or 130''' is less than seven percent. In some embodiments, the lattice mismatch between the symmetry filter layer 120''' and the layer(s) 110''' and/or 130" may be less than three percent or four percent. For example, the symmetry filter 120''' may include Ge, GaAs and or ZnSe. The pinned layer 110''' and/or the free layer 130''' may include MnGa and/or MnIn.

The magnetic junction 100''' shares the benefits of the magnetic junctions 100/100'/100". Because the magnetic moment 111''' is perpendicular to plane, the quantity $<H>_{eff}/H_k$ is one. In addition, the spin polarization efficiency may be improved. Consequently, performance of the magnetic junction 100''' may be enhanced.

Figure 8:
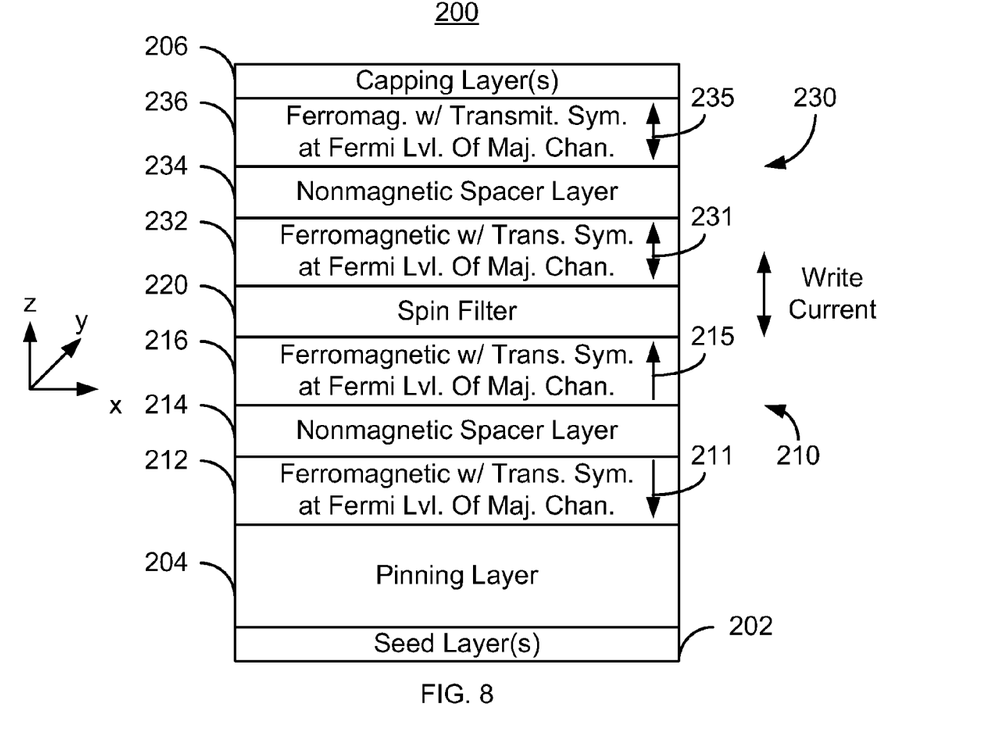
FIG. 8 depicts another exemplary embodiment of a magnetic junction suitable for use in a magnetic memory.

FIG. 8 depicts another exemplary embodiment of a magnetic junction 200 suitable for use in a magnetic memory. For clarity, FIG. 8 is not to scale. The magnetic junction 200 includes components analogous to the magnetic junctions 100/100' depicted in FIGS. 2 and 5. Consequently, analogous components are labeled similarly. Thus, the magnetic junction 200 includes a pinned layer 210, a symmetry filter 220, and a free layer 230 analogous to the pinned layer 110/110', a symmetry filter 120/120', and the free layer 130/130', respectively. Also shown are seed layer(s) 202, pinning layer 204, and capping layer 206 analogous to seed layer 102, pinning layer 104, and capping layer 106, respectively. In other embodiments, the seed layer(s) 202, pinning layer 204, and/or capping layer 206 may be omitted. In addition, contacts (not shown) may also be provided to drive current in the desired direction.

In the embodiment shown, the pinned layer 210 and the free layer 230 are SAFs. Thus, the pinned layer 210 includes ferromagnetic layers 212 and 216 separated by nonmagnetic spacer layer 214. Similarly, the free layer 230 includes ferromagnetic layers 232 and 236 separated by nonmagnetic spacer layer 234. Spacer layers 214 and 234 are typically Ru.

In the embodiment shown, the magnetic moments 211 and 215 of the pinned layer 210 and the magnetic moments 231 and 235 of the free layer 230 are perpendicular to plane. In addition, both the free layer 130' and the pinned layer 110' are configured such that each of the layers 210 and 230 has its charge carriers of the symmetry transmitted by the symmetry filter 220 at a Fermi level in a spin channel, such as majority spin channel. In some embodiments, at least one of the free layer 230 and the pinned layer 210 lacks the charge carriers of the symmetry at the Fermi level in the other spin channel, such as a minority spin channel. For example, both the ferromagnetic layers 212 and 216 of the pinned layer 210 and the ferromagnetic layers 232 and 236 free layer 230 may include AlMn having an $L1_0$ crystal structure and a (100) axis perpendicular to plane. However, for such embodiments, the spacer layers 214 and 234 are capable of allowing for antiferromagnetic coupling between the ferromagnetic layers 212 and 216 and between the layers 232 and 236. In addition, the spacer layers 214 and 234 would provide the appropriate growth template for the desired crystal structure and texture of the layers 216 and 236. In addition MgO having a (100) texture or $SrSnO_3$ may be used as the spin filter 220. In some embodiments, the lattice mismatch between the symmetry filter 220 and the layer(s) 216 and/or 232 is less than seven percent. In some embodiments, the lattice mismatch between the symmetry filter layer 220 and the layer(s) 216 and/or 232 may be less than three percent or four percent. For example, the symmetry filter 220 may include Ge, GaAs and or ZnSe. The layer 232 and/or the layer 216 may include MnGa and/or MnIn.

Figure 9:
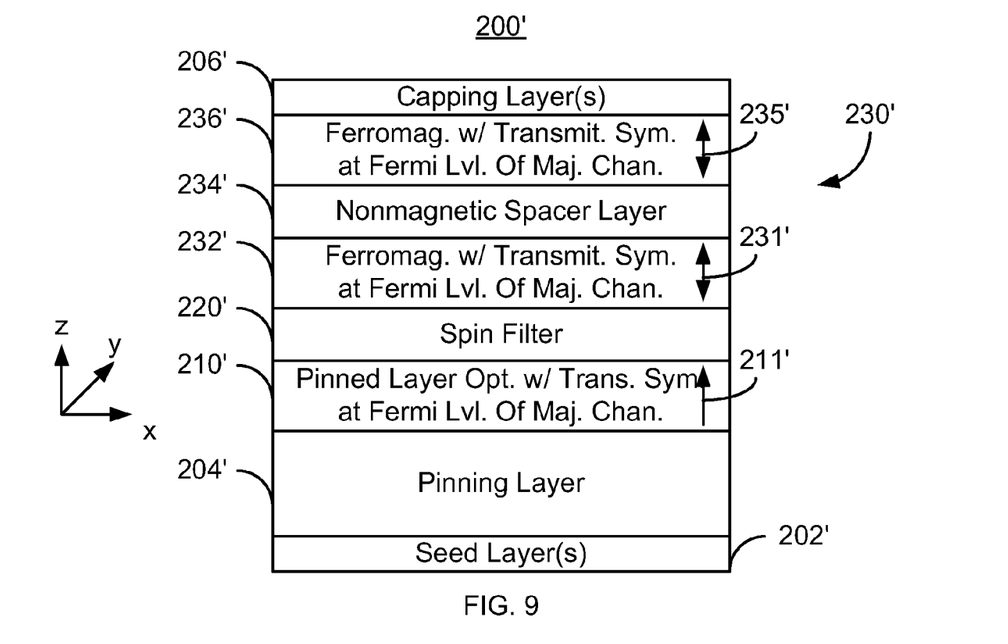
FIG. 9 depicts another exemplary embodiment of a magnetic junction suitable for use in a magnetic memory.

FIG. 9 depicts another exemplary embodiment of a magnetic junction 200' suitable for use in a magnetic memory. For clarity, FIG. 9 is not to scale. The magnetic junction 200' includes components analogous to the magnetic junctions 100/100'/200. Consequently, analogous components are labeled similarly. Thus, the magnetic junction 200' includes a pinned layer 210', a symmetry filter 220', and a free layer 230' analogous to layers 210/110/110', 220/120/120', and 230/130/130', respectively. Also shown are seed layer(s) 202', pinning layer 204', and capping layer 206'. In other embodiments, the seed layer(s) 202', pinning layer 204', and/or capping layer 206' may be omitted. The seed layer(s) 202' may be used to provide a template for the desired crystal structure of the pinning layer 204'. The pinning layer 204' may include an AFM layer, a hard magnet or other material used to pin the magnetization of the pinned layer 210'''. In addition, contacts (not shown) may also be provided to drive current in the desired direction.

In the embodiment shown, the free layer 230' is a SAF including layers 232', 234', and 236' analogous to layers 232, 234, and 236. In the embodiment shown, the magnetic moments 231 and 235 of the free layer 230' are perpendicular to plane. In other embodiments, the magnetic moment of the pinned layer 210' is perpendicular to plane. In addition, the free layer 230' is configured such that the layer 230' has its charge carriers of the symmetry transmitted by the symmetry filter 220' at a Fermi level in a majority spin channel. In some embodiments, the free layer 230' lacks the charge carriers of the symmetry at the Fermi level in a minority spin channel. For example, the free layer 230' may include AlMn having an $L1_0$ crystal structure and a (100) axis perpendicular to plane. In addition MgO having a (100) texture or $SrSnO_3$ may be used as the spin filter 220'.

In the embodiment shown, the magnetic moments 231' and 235' of the free layer 230' are perpendicular to plane. In addition, the free layer 230' is configured such that the layer 230' has its charge carriers of the symmetry transmitted by the symmetry filter 220' with a higher probability at a Fermi level in one spin channel. For example, the majority spin channel may include charge carriers of the symmetry at the Fermi level. In some embodiments, the free layer 230' lacks the charge carriers of the symmetry transmitted with a higher probability at the Fermi level in the other spin channel, such as the minority spin channel. For example, the free layer 130' may include AlMn having an $L1_0$ crystal structure and a (100) axis perpendicular to plane. In addition MgO having a (100) texture or $SrSnO_3$ may be used as the spin filter 220'. The pinned layer 210' may include other magnetic materials. For example, the pinned layer 210' include bcc (001) Fe, bcc (001) Co, and/or bcc (001) FeCo. Although the pinned layer magnetic moment 211' is shown as perpendicular to plane, other orientations are possible. In some embodiments, the lattice mismatch between the symmetry filter 220' and the layer(s) 210' and/or 232' is less than seven percent. In some embodiments, the lattice mismatch between the symmetry filter layer 220' and the layer(s) 210' and/or 232' may be less than three percent or four percent. For example, the symmetry filter 220' may include Ge, GaAs and or ZnSe. The layer 232' and/or the layer 210' may include MnGa and/or MnIn.

Figure 10:
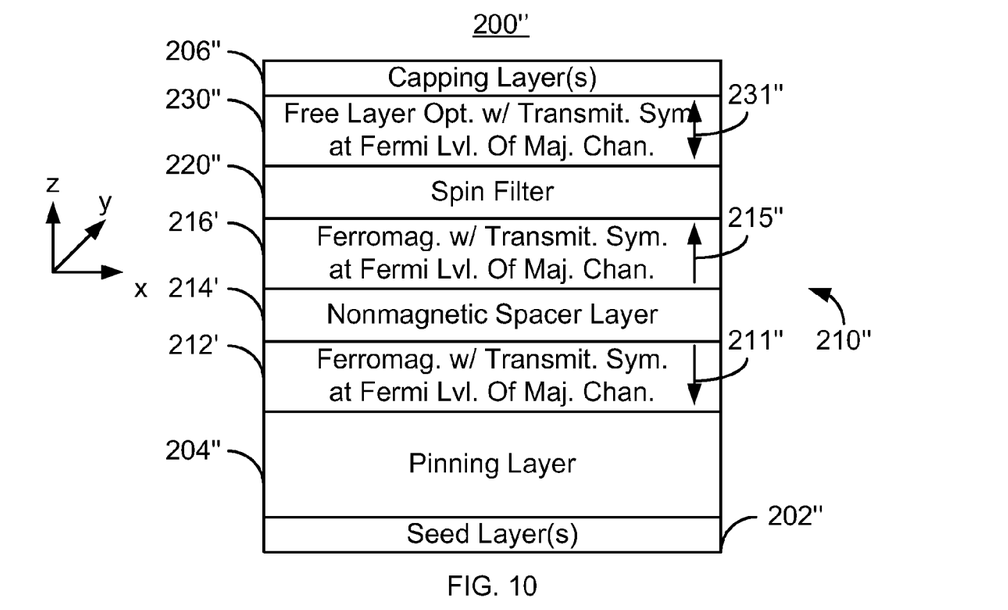
FIG. 10 depicts another exemplary embodiment of a magnetic junction suitable for use in a magnetic memory.

FIG. 10 depicts another exemplary embodiment of a magnetic junction 200'' suitable for use in a magnetic memory. For clarity, FIG. 10 is not to scale. The magnetic junction 200'' includes components analogous to the magnetic junctions 100/100''/200/200'. Consequently, analogous components are labeled similarly. Thus, the magnetic junction 200'' includes a pinned layer 210'', a symmetry filter 220'', and a free layer 230'' analogous to layers 210/210'/110/110', 220/220'/120/120', and 230/230'/130/130', respectively. Also shown are seed layer(s) 202'', pinning layer 204'', and capping layer 206''. In other embodiments, the seed layer(s) 202'', pinning layer 204'', and/or capping layer 206'' may be omitted. The seed layer(s) 202'' may be used to provide a template for the desired crystal structure of the pinning layer 204''. The pinning layer 204'' may include an AFM layer, a hard magnet or other material used to pin the magnetization of the pinned layer 210''. In addition, contacts (not shown) may also be provided to drive current in the desired direction.

In the embodiment shown, the pinned layer 210'' is a SAF including layers 212', 214', and 216' analogous to layers 212, 214, and 216. In the embodiment shown, the magnetic moments 211' and 215' of the pinned layer 210'' are perpendicular to plane. In other embodiments, the magnetic moment of the free layer 230'' is perpendicular to plane. In addition, the pinned layer 210'' is configured such that the layer 210'' has its charge carriers of the symmetry transmitted by the symmetry filter 220'' with a higher probability at a Fermi level in a spin channel (e.g. the majority spin channel). In some embodiments, the pinned layer 210'' lacks the charge carriers of the symmetry at the Fermi level in the other spin channel (e.g. a minority spin channel). For example, the pinned layer 210'' may include AlMn having an $L1_0$ crystal structure and a (100) axis perpendicular to plane. In addition MgO having a (100) texture or $SrSnO_3$ may be used as the spin filter 220''.

In the embodiment shown, the magnetic moments 211 and 215 of the pinned layer 210'' are perpendicular to plane. In addition, the pinned layer 210'' is configured such that the layer 210'' has its charge carriers of the symmetry transmitted by the symmetry filter 220'' with a higher probability at a Fermi level in one spin channel such as a majority spin channel. In some embodiments, the pinned layer 210'' lacks the charge carriers of the symmetry at the Fermi level in the other spin channel, such as a minority spin channel. For example, the pinned layer 210'' may include AlMn having an $L1_0$ crystal structure and a (100) axis perpendicular to plane. In addition MgO having a (100) texture or SrSnO$_3$ may be used as the spin filter 220". The free layer 230" may include other magnetic materials. For example, the free layer 230" include bcc (001) Fe, bcc (001) Co, and/or bcc (001) FeCo. Although the free layer magnetic moment 231" is shown as perpendicular to plane, other orientations are possible. In some embodiments, the lattice mismatch between the symmetry filter 220" and the layer(s) 216' and/or 230" is less than seven percent. In some embodiments, the lattice mismatch between the symmetry filter layer 220" and the layer(s) 216' and/or 230" may be less than three percent or four percent. For example, the symmetry filter 220" may include Ge, GaAs and or ZnSe. The layer 230" and/or the layer 216' may include MnGa and/or MnIn.

The magnetic junctions 200, 200', and 200" share the benefits of the magnetic junctions 100/100'/100". Because the magnetic moments of the layers 210/210'/210" and 230/230'/230" may be perpendicular to plane, the quantity $<H>_{eff}/H_k$ is one. In addition, the spin polarization efficiency may be improved. Consequently, performance of the magnetic junctions 200, 200', and 200" may be enhanced.

Figure 11:
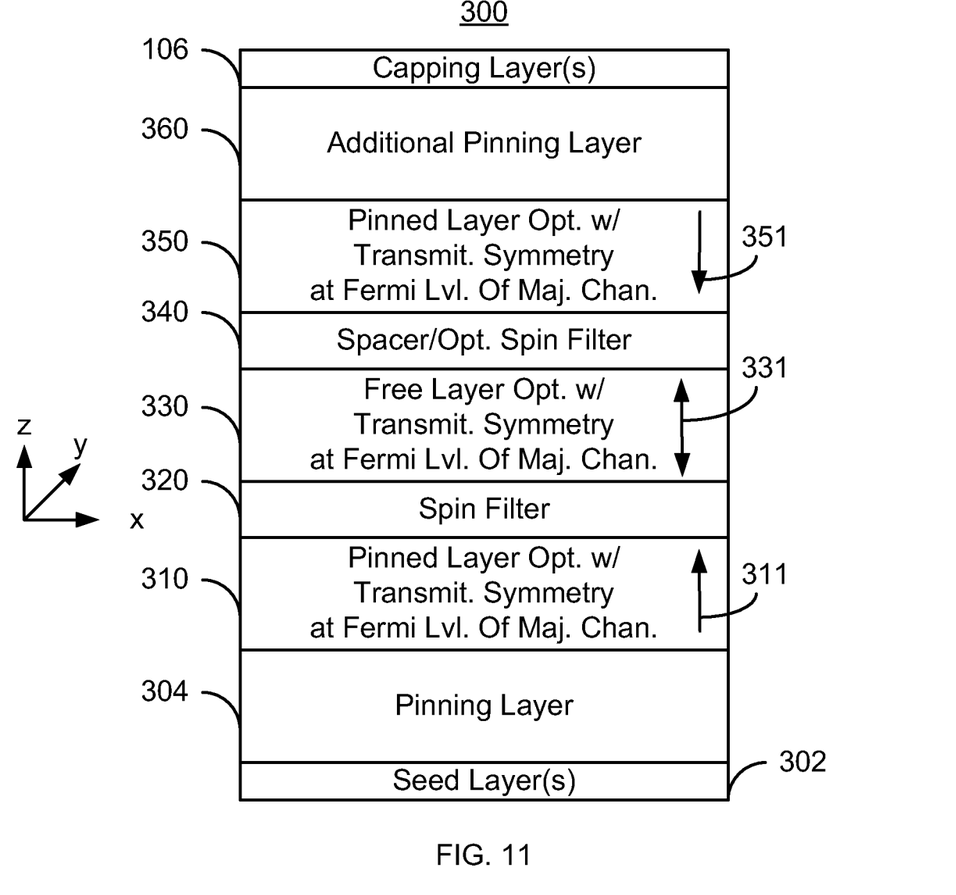
FIG. 11 depicts another exemplary embodiment of a dual magnetic junction suitable for use in a magnetic memory.

FIG. 11 depicts another exemplary embodiment of a magnetic junction 300 suitable for use in a magnetic memory. For clarity, FIG. 11 is not to scale. The magnetic junction 300 includes components analogous to the magnetic junctions 100/100'/100"/100'''/200/200'/200" depicted in FIGS. 2 and 5-10. Consequently, analogous components are labeled similarly. Thus, the magnetic junction 300 includes a pinned layer 310, a symmetry filter 320, and a free layer 330 analogous to the pinned layer 110/110'/210, a symmetry filter 120/120'/220, and the free layer 130/130'/230, respectively. Also shown are seed layer(s) 302, pinning layer 304, and capping layer 306 analogous to seed layer 102/102'/102"/202/202'/202", pinning layer 104/104'/104"/204/204'/204"/204''', and capping layer 106/106'/106"/206/206'/206", respectively. In other embodiments, the seed layer(s) 302, pinning layer 304, and/or capping layer 306 may be omitted. The magnetic junction 300 also includes an additional spacer layer 340, an additional pinned layer 350, and an additional pinning layer 360. Thus, the magnetic junction 300 may be considered to include a magnetic element analogous to the magnetic elements 100/100'/100"/100'''/200/200'/200" plus additional layers 340, 350, and 360.

In the embodiment shown, the additional spacer layer 340 may be a tunneling barrier layer. In other embodiments, the additional spacer layer 340 may be conductive. Further, in some embodiments the additional spacer layer 340 may be a symmetry filter, such as MgO described above. The additional pinned layer 350 may be analogous to the layers 110/110'/110"/110'''/210/210'/210". Thus, the pinned layer 350 may have its charge carriers of the symmetry transmitted by the symmetry filter 320 with a higher probability at a Fermi level in a spin channel, such as the majority spin channel. In some embodiments, the additional pinned layer 350 lacks the charge carriers of the symmetry at the Fermi level in another spin channel, such as the minority spin channel. For example, both the pinned layer 350 may include AlMn having an $L1_0$ crystal structure and a (100) axis perpendicular to plane. The magnetic moment 351 of the additional pinned layer may thus be perpendicular to plane. Note that although the magnetic moments 311 and 351 are shown anti-parallel, other configurations may be used. In addition MgO having a (100) texture or SrSnO$_3$ may be used so that the spacer layer 340 acts as a spin filter. Further, although shown as simple layers, one or more of the layers 310, 330, and 350 may be a SAF. In some embodiments, the lattice mismatch between the symmetry filter 320 and the layer(s) 330 and/or 310 is less than seven percent. In some embodiments, the lattice mismatch between the symmetry filter layer 320 and the layer(s) 310 and/or 330 may be less than three percent or four percent. For example, the symmetry filter 320 may include Ge, GaAs and or ZnSe. The layer 330 and/or the layer 310 may include MnGa and/or MnIn. Similarly, if the layer 340 is a symmetry filter, then the lattice mismatch between the symmetry filter 340 and the layer(s) 330 and/or 360 is less than seven percent. In some embodiments, the lattice mismatch between the symmetry filter layer 340 and the layer(s) 330 and/or 360 may be less than three percent or four percent. For example, the symmetry filter 340 may include Ge, GaAs and or ZnSe. The layer 330 and/or the layer 360 may include MnGa and/or MnIn.

The dual magnetic junctions 300 shares the benefits of the magnetic junctions 100/100'/100"/200/200'/200". Because the magnetic moments of the layers 210/210'/210"/310, 230/230'/230"/330, and optionally 350 may be perpendicular to plane, the quantity $<H>_{eff}/H_k$ is one. In addition, the spin polarization efficiency may be improved. Consequently, performance of the magnetic junction 300 may be improved.

Figure 12:
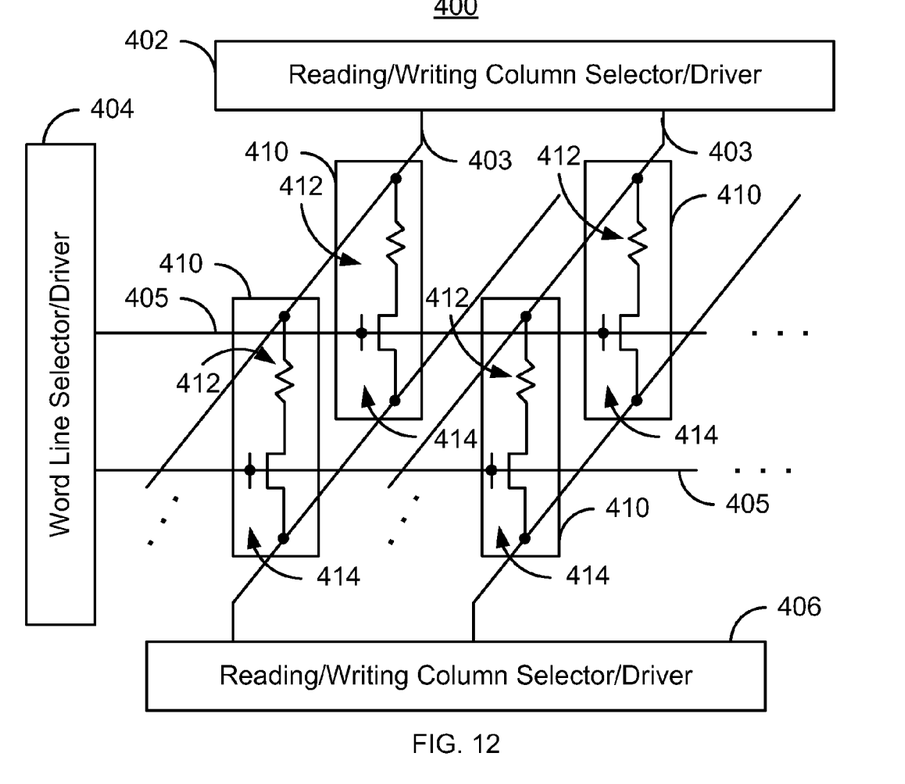
FIG. 12 depicts an exemplary embodiment of a magnetic memory utilizing a magnetic junction.

FIG. 12 depicts an exemplary embodiment of a magnetic memory 400 utilizing a dual magnetic junction. In the embodiment shown, the magnetic memory is a STT-RAM 400. The magnetic memory 400 includes reading/writing column selector/drivers 402 and 406 as well as word line selector/driver 404. The magnetic memory 400 also includes memory cells 410 including a magnetic junction 412 and a selection/isolation device 414. The magnetic junction 412 may be any magnetic junction 100/100'/100"/100'''/200/200'/200"/300. The reading/writing column selector/drivers 402 and 406 may be used to selectively drive current through the bit lines 403 and thus the cells 410. The word line selector/driver 404 selectively enables row(s) of the magnetic memory 400 by enabling the selection/isolation device 414 coupled with the selected word line 405.

Because the magnetic memory 400 may use the magnetic junctions 100/100'/100"/100'''/200/200'/200"/300, the magnetic memory 400 share the benefits of the magnetic junctions 100/100'/100"/100'''/200/200'/200". Consequently, performance of the magnetic memory 400 may be improved.

Figure 13:
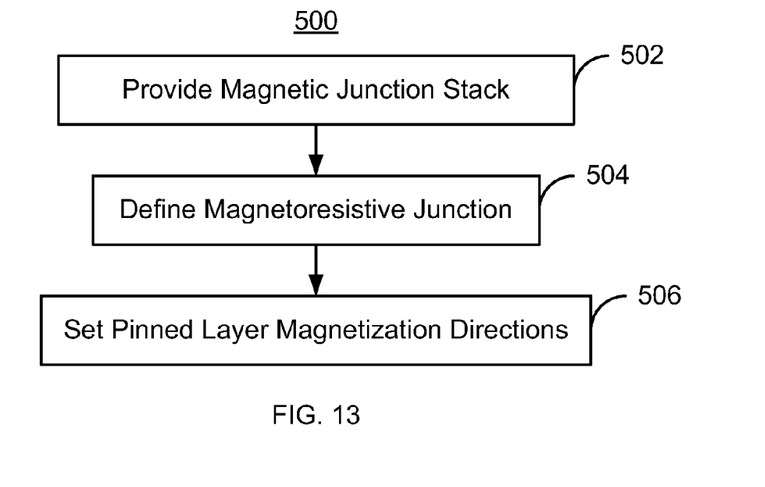
FIG. 13 depicts an exemplary embodiment of a method for fabricating a magnetic tunneling junction suitable for use in a magnetic memory.

FIG. 13 depicts an exemplary embodiment of a method 500 for fabricating dual magnetic tunneling junction suitable for use in a magnetic memory. The method 500 is described in the context of the magnetic junctions 100/100'. However, the method 500 may also be used to fabricate other magnetic junctions. In addition, for simplicity, some steps may be omitted. In addition, the method 500 may combine and/or use additional and/or other steps. The method 500 is also described in the context of fabricating a single magnetic junction. However, the method 500 generally forms multiple magnetic junctions in parallel, for example for the memory 300.

A magnetic junction stack is provided, via step 502. The magnetic junction stack includes a pinned layer film, a spin filter film, and a free layer film. The stack may also include a spacer layer film and an additional pinned layer film if the magnetic junction 300 is to be fabricated. In some embodiments, the magnetic junction stack may also be annealed in step 502.

The magnetic junction 100/100'/100"/100'''/200/200'/200"/300 is defined from the magnetic junction stack, via step 504. Step 504 includes providing a mask that covers a portion of the magnetic junction stack, then removing the exposed portions of the magnetic junction stack. The magnetic junction 100/100'/100"/100'''/200/200'/200"/300 includes a pinned layer 110/110'/110"/110'''/210/210'/210"/310 defined from the first pinned layer film, a symmetry filter 120/120'/

120"/220/220'/220"/320 defined from the spin filter film, and a free layer 130/130'/130"/130"'/230/230'/7230"330 defined from the free layer film. In some embodiments, the magnetic junction 300 also includes a spacer layer 340 and an additional pinned layer 350.

The magnetization directions of the pinned layers 110/110'/110"/110"'/210/210'/210"/310 are set, via step 506. For example, step 506 may be performed by applying a magnetic field in the desired direction while the magnetic junction 100/100'/100"/100"'/200/200'/200"/300 are heated, then cooling the magnetic junction 100/100'/100"/100"'/200/200'/200"/300 in the presence of the field.

Thus, the magnetic junction 100/100'/100"/100"'/200/200'/200"/300 may be fabricated. A magnetic junction and/or the magnetic memory 400 fabricated through the method 500 shares the benefits of the magnetic junctions 100/100'/100"/100"'/200/200'/200" and/or the magnetic memory 300. Consequently, performance of the magnetic junctions 100/100'/100"/200/200'/200" and/or the magnetic memory 300 may be improved.

A method and system for providing a magnetic junction and memory fabricated using the magnetic memory junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

I claim:

1. A magnetic junction comprising:
a free layer having a first magnetic moment switchable between a plurality of stable magnetic states when a write current is passed through the magnetic junction;
a symmetry filter that transmits charge carriers having a first symmetry with a higher probability than the charge carriers having a second symmetry;
a pinned layer having a second magnetic moment pinned in a particular direction, the symmetry filter residing between the free layer and the pinned layer;
wherein at least one of the free layer and the pinned layer has the charge carriers of the first symmetry at a Fermi level in a spin channel, lacks the charge carriers of the first symmetry at the Fermi level in another spin channel, lies substantially in a plane and has a nonzero magnetic moment component substantially perpendicular to the plane, the symmetry filter and at least one of the free layer and the pinned layer having a lattice mismatch of less than seven percent.

2. The magnetic junction of claim 1 wherein the lattice mismatch is less than four percent.

3. The magnetic junction of claim 1 wherein the at least one of the free layer and the pinned layer include AlMn.

4. The magnetic junction of claim 1 wherein the symmetry filter includes at least one of Ge, GaAs and ZnSe.

5. The magnetic junction of claim 1 wherein the first magnetic moment is substantially perpendicular to the plane.

6. The magnetic junction of claim 1 wherein the second magnetic moment is substantially perpendicular to the plane.

7. The magnetic junction of claim 1 wherein the at least one of the free layer and the pinned layer includes at least one of MnGa and MnIn.

8. The magnetic junction of claim 1 wherein the symmetry filter is a tunneling barrier layer.

9. The magnetic junction of claim 1 wherein at least one of the free layer and the pinned layer is a synthetic antiferromagnet.

10. The magnetic junction of claim 1 further comprising:
a spacer layer; and
an additional pinned layer, the spacer residing between the free layer and the additional pinned layer, the additional pinned layer having a third magnetic moment.

11. The magnetic junction of claim 10 wherein the additional pinned layer includes AlMn.

12. The magnetic junction of claim 10 wherein the spacer layer is an additional symmetry filter.

13. The magnetic junction of claim 11 wherein the additional symmetry filter and at least one of the free layer and the additional pinned layer have an additional lattice mismatch of less than seven percent.

14. The magnetic junction of claim 13 wherein the additional lattice mismatch is less than four percent.

15. The magnetic junction of claim 12 wherein the additional symmetry filter includes at least one of Ge, GaAs and ZnSe.

16. The magnetic junction of claim 1 wherein at least one of the free layer, the pinned layer, and the additional pinned layer is a synthetic antiferromagnet.

* * * * *